United States Patent
Tanaka et al.

(10) Patent No.: US 6,310,423 B1
(45) Date of Patent: Oct. 30, 2001

(54) SURFACE ACOUSTIC WAVE DEVICE

(75) Inventors: Naoki Tanaka, Sakai; Morio Ogura, Hirakata, both of (JP)

(73) Assignee: Sanyo Electric Co., LTD, Osaka (JP)

( * ) Notice: Subject to any disclaimer, the term of this patent is extended or adjusted under 35 U.S.C. 154(b) by 0 days.

(21) Appl. No.: 09/533,666

(22) Filed: Mar. 23, 2000

(30) Foreign Application Priority Data

Mar. 25, 1999 (JP) .................................................. 11-081456

(51) Int. Cl.⁷ .................................................. H01L 41/107
(52) U.S. Cl. .................................... 310/313 A; 310/313 R
(58) Field of Search ............................. 310/313 A, 313 R

(56) References Cited

U.S. PATENT DOCUMENTS

| | | | |
|---|---|---|---|
| 4,571,519 | * | 2/1986 | Kawabata et al. ............... 310/313 A |
| 4,752,709 | * | 6/1988 | Fuhishima et al. ............... 310/313 A |
| 6,025,636 | * | 2/2000 | Nakahata et al. ................ 310/313 A |

* cited by examiner

Primary Examiner—Thomas M. Dougherty
(74) Attorney, Agent, or Firm—Armstrong, Westerman, Hattori, McLeland & Naughton, LLP

(57) ABSTRACT

An SAW device includes a glass substrate, an $LiNbO_3$ (LN) substrate, and an electrode. When a pitch of the electrode is $\lambda$, a thickness of the LN substrate is H, and K equals to $2\pi/\lambda$, a product of K and H is at least 0.5 and at most 1.0. Accordingly, an SAW device is obtained which is provided with high $K^2$ and an enhanced temperature characteristic and which can be advantageously reduced in size.

5 Claims, 7 Drawing Sheets

SURFACE ACOUSTIC WAVE DEVICE

BACKGROUND OF THE INVENTION

1. Field of the Invention

The present invention relates to surface acoustic wave (SAW) devices.

2. Description of the Background Art

SAW devices include SAW oscillators, transversal SAW filters and oscillator type SAW filters, which are used according to different purposes. In the following, an SAW filter will be described as one type of SAW devices FIG. 11 is a perspective view schematically showing a structure of an SAW filter. Referring to FIG. 11, SAW filter 15 basically includes a piezoelectric substrate 12, and a four-terminal structure formed on a surface of piezoelectric substrate 12 and having two pairs of comb-shaped electrodes 13 respectively used for exciting and receiving surface waves. Such electrodes 13 are called interdigital electrodes, and this type of transducer is called an IDT (Interdigital Transducer).

Referring to FIG. 12, generally, when an impulse voltage is applied to comb-shaped electrodes 13 for excitation, strains of opposite phases are caused between adjacent electrodes 13 by a piezoelectric effect, thereby exciting an SAW. The SAW propagates on the surface of piezoelectric substrate 12. The strains caused by the SAW produces electric charges at the surface of piezoelectric substrate 12, which are in turn received as electric signals by comb-shaped electrodes 13 for reception.

Conventionally, the SAW device such as SAW filter 15 has a structure in which electrodes 13 in accordance with the purpose of the device are formed on the surface of piezoelectric substrate 12, as shown in FIG. 13. The characteristic of SAW device 15 depends largely on the characteristic of piezoelectric substrate 12, which is also used according to the purpose of the device. Table 1 shows typical materials used for piezoelectric substrate 12 and characteristics of an SAW propagating on piezoelectric substrate 12.

TABLE 1

Characteristics of Substrate for Typical SAW device

| substrate | Eulerian angles φ, θ, ψ | propagation velocity [m/s] | $K^2$ [%] | TCD [ppm/° C.] | propagation mode |
|---|---|---|---|---|---|
| quartz | 0°, 132.75°, 0° | 3159 | 0.12 | 0 | Rayleigh wave |
|  | 0°, 15°, 0° | 3948 | 0.11 | 0 | Leaky wave |
| LiTaO$_3$ | 90°, 90°, 112° | 3328 | 1.1 | 16.5 | Rayleigh wave |
|  | 0°, 126°, 0° | 4211 | 4.7 | 45.1 | Leaky wave |
| LiNbO$_3$ | 0°, 38°, 0° | 4007 | 5.2 | 71.4 | Rayleigh wave |
|  | 0°, 154°, 0° | 4731 | 10.9 | 61.3 | Leaky wave |

As shown in Table 1, a quartz substrate has a good temperature characteristic (value near zero), but electromechanical coupling factor ($K^2$) is disadvantageously small. For an LiNbO$_3$ (LN) substrate, although $K^2$ is sufficiently high, the temperature characteristic such as a temperature coefficient of delay time (TCD) is disadvantageously high.

Thus, the substrates have their own advantages and deficiencies, so that they are used according to the specific purposes of the device. Recently, with a technological development in the field of display units including televisions and telecommunication apparatuses including portable telephones, SAW devices used therefor are also required to have enhanced properties.

Now, Eulerian angles in the above Table 1 will be described with reference to FIG. 14.

Referring to FIG. 14, the X axis is rotated by an angle φ toward the Y axis about the Z axis, and the axis obtained is defined as the first axis. Then, the Z axis is rotated counterclockwise by an angle θ about the first axis, and the axis obtained is defined as the second axis. A material is cut in accordance with a surface orientation along a plane including the first axis and having the second axis as the normal, and used as a substrate. On the substrate which has been cut in accordance with the above mentioned surface orientation, the first axis is rotated counterclockwise by ψ about the second axis, and newly defined as the third axis. The third axis corresponds to a direction in which the SAW propagates. An axis orthogonal to the third axis on the plane is defined as the fourth axis. Thus, the Eulerian angles (φ, θ, ψ) are defined.

A center frequency $f_0$ of an SAW device is determined in accordance with the following equation.

$$f_0 = V/\lambda$$

(V: propagation velocity of SAW, λ: electrode pitch of IDT (FIG. 11)) Thus, in producing devices having the same center frequency $f_0$, if the IL substrate with relatively high propagation velocity V as compared with that of the quartz substrate or the like is used, electrode pitch λ of IDT increases and the size of SAW device is increased.

It is commonly believed that with the higher $K^2$ a piezoelectric substrate has, the easier the design of a device with a large bandwidth is. However, the LN substrate with high $K^2$ is accompanied by high TCD, and is not suitable for a device which should have a good temperature characteristic.

SUMMARY OF THE INVENTION

One object of the present invention is to provide an SAW device which can be reduced in size by lowering a propagation velocity and which is provided with high $K^2$ and a good temperature characteristic.

After intensively studying to achieve the above mentioned object, the present inventors have found that a combination of a piezoelectric substrate including LN and a glass substrate makes it possible to reduce the size of an SAW device, and that high $K^2$ and a good temperature characteristic could be obtained if electrode pitch λ and a thickness H of a piezoelectric substrate are set in a prescribed range.

Accordingly, the SAW device of the present invention is provided with a glass substrate, a piezoelectric substrate including LN formed on the glass substrate, and an electrode formed on the piezoelectric substrate. If an electrode pitch is λ, a thickness of the piezoelectric substrate is H, and K equals to 2π/λ, then a product of K and H (KH) is at least 0.5 and at most 1.0.

The sound velocity of the glass substrate is lower than that of the piezoelectric substrate including LN. If the glass substrate and the piezoelectric substrate are combined, the piezoelectric substrate is affected by the glass substrate, whereby the sound velocity of the SAW decreases. For example, the thinner the piezoelectric substrate is, the more significantly the glass substrate affects and the lower the sound velocity of the SAW is. If the thickness of the piezoelectric substrate is gradually increased, the sound velocity of the SAW gradually converges at that of the piezoelectric substrate.

When the glass substrate and the piezoelectric substrate are bonded, the sound velocity of the SAW can be lowered by adjusting the thicknesses of the substrates. Thus, electrode pitch λ of the IDT is reduced and a smaller SAW device is achieved.

An electric field distribution varies with thickness H of piezoelectric substrate and electrode pitch λ. Here, the electric field distribution can be adjusted to concentrate in the piezoelectric substrate as the glass substrate and the piezoelectric substrate are combined and KH is set to at least 0.5 and at most 1.0. Thus, the SAW is efficiently excited, whereby $K^2$ is enhanced.

KH is set to at least 0.5 and at most 1.0 because if KH is below 0.5 or above 1.0, the sound velocity of the SAW increases, whereby it becomes difficult to reduce the size of the SAW device.

The signs of TCD and TCV (temperature coefficient of sound velocity (propagation velocity)) of the glass substrate are opposite to those of the piezoelectric substrate including LN. As to TCV, for example, the piezoelectric substrate including LN has a plus value, whereas the glass substrate has a minus value. Thus, if these substrates are bonded together, TCDs and TCVs thereof are mutually cancelled and the temperature characteristic is enhanced.

After intensively studying, the present inventors have found that setting Eulerian angles in a prescribed range could produce high $K^2$ and good temperature characteristic.

Accordingly, in the above described SAW device, LN is preferably (30°, 80° to 100°, 130° to 145°) in an Eulerian angles representation.

As a result, a substrate of the SAW device is obtained with high $K^2$ which is approximately the same as that of the conventional 128° Y-X LN substrate, as well as a temperature characteristic which is better and a propagation velocity which is lower than those of the 128° Y-X LN substrate.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Now, the embodiment of the present invention will be described with reference to the drawings.

Figure 1:
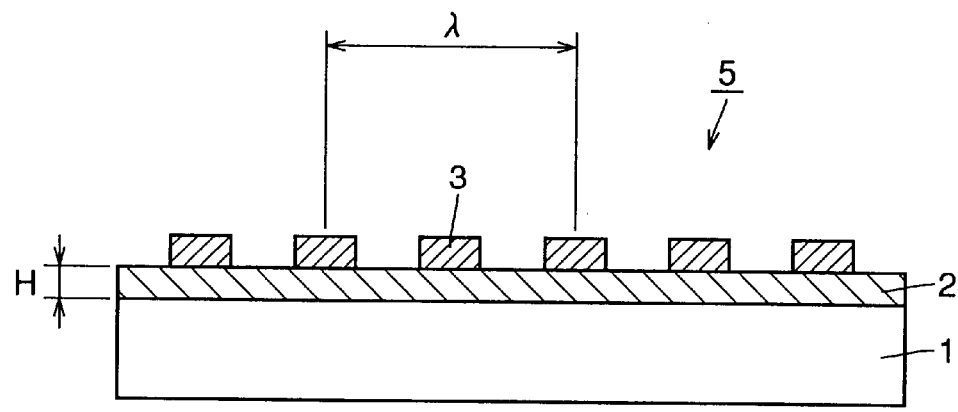
FIG. 1 is a schematic cross sectional view showing a structure of an SAW device according to one embodiment of the present invention.

Referring to FIG. 1, an SAW device 5 includes a glass substrate 1, a piezoelectric substrate 2, and an electrode 3. Piezoelectric substrate 2 is formed on glass substrate 1 and includes LN. Electrode 3 is formed on piezoelectric substrate 2 in accordance with the purpose of the device.

Such an SAW device 5 is obtained by bonding LN substrate 2 on the surface of glass substrate 1 or forming an LN thin film 2 on the surface of glass substrate 1, and then patterning to form electrode 3 on LN substrate (thin film) 2.

For a material of glass substrate 1, for example, quartz glass, aluminosilicate glass, borosilicate glass, soda glass, lead silicate glass or the like is used.

The substrate which is combined with LN substrate 2 is not limited to the glass substrate, and any material having a sound velocity lower than that of LN and having a sign which is opposite to those of TCD and TCV of LN may be used.

In addition, the material of piezoelectric substrate 2 may only or partially include LN. For example, aluminum, although not limited, may be used as the material of electrode 3.

If the thickness of piezoelectric substrate 2 is H, the pitch of electrode 3 is λ, and K equals to 2π/λ, then KH is at least 0.5 and at most 1.0.

LN of piezoelectric substrate 2 is preferably (30°, 80° to 100°, 130° to 145°) in an Eulerian angles representation.

In the present embodiment, the combination of glass substrate 1 and LN substrate 2 enables the SAW device to be reduced in size. More specifically, glass substrate 1 is formed of a material having a sound velocity lower than that of LN substrate 2. The combination of glass substrate 1 and LN substrate 2 permits an influence of glass substrate 1 over LN substrate 2, so that the sound velocity of the SAW is reduced. Thus, electrode pitch λ is reduced and the SAW device per se is reduced in size.

Further, an electric field distribution varies with thickness H of LN substrate 2 and electrode pitch λ. Thus, by combining glass substrate 1 and LN substrate 2 and restricting KH to at least 0.5 and at most 1.0, the electric field distribution can be adjusted to concentrate in LN substrate 2. Accordingly, the SAW is effectively excited and $K^2$ is increased.

It is noted that KH is restricted at least 0.5 and at most 1.0 because if KH is below 0.5 or above 1.0, the sound velocity of the SAW increases, whereby it becomes difficult to reduce the size of the SAW device.

Further, the combination of glass substrate 1 and LN substrate 2 enhances TCD and TCV. More specifically, as TCD and TCV of glass substrate 1 have signs opposite to those of LN substrate 2 (in the case of TCV, for example, LN substrate 2 has a plus value, whereas glass substrate 1 has a minus value), the combination of substrates 1 and 2 makes it possible to cancel TCDs and TCVs of the substrates. Therefore, a good temperature characteristic is obtained.

Figure 2:
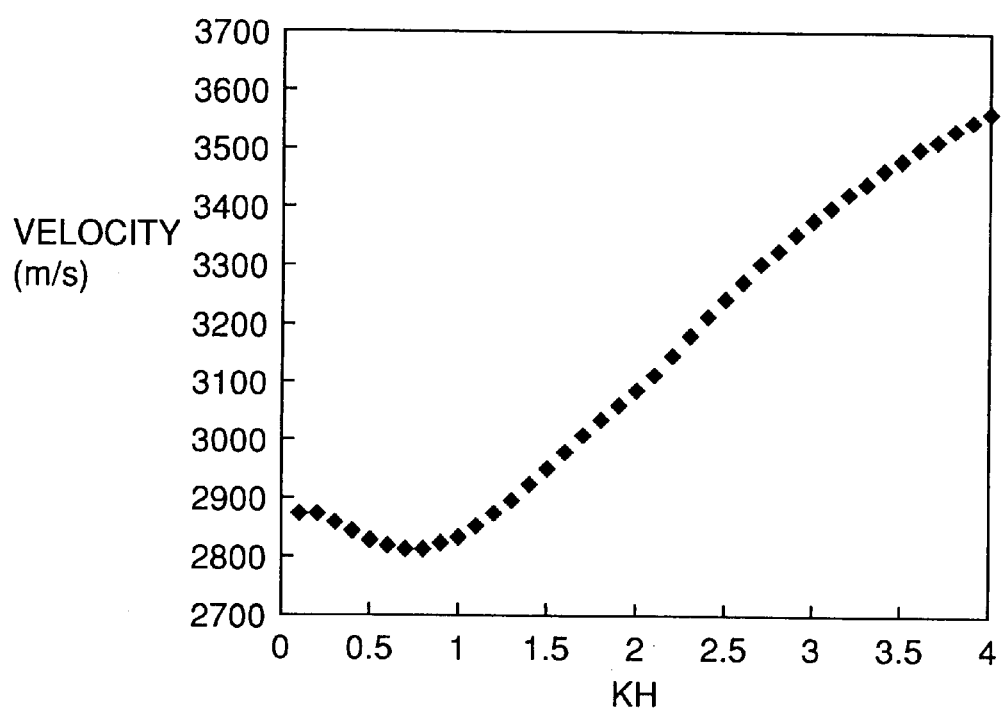
FIG. 2 is a graph shown in conjunction with a relationship between a propagation velocity of (0°, 0°, 0°) LN/glass-structure substrate and a value of KH.
Figure 3:
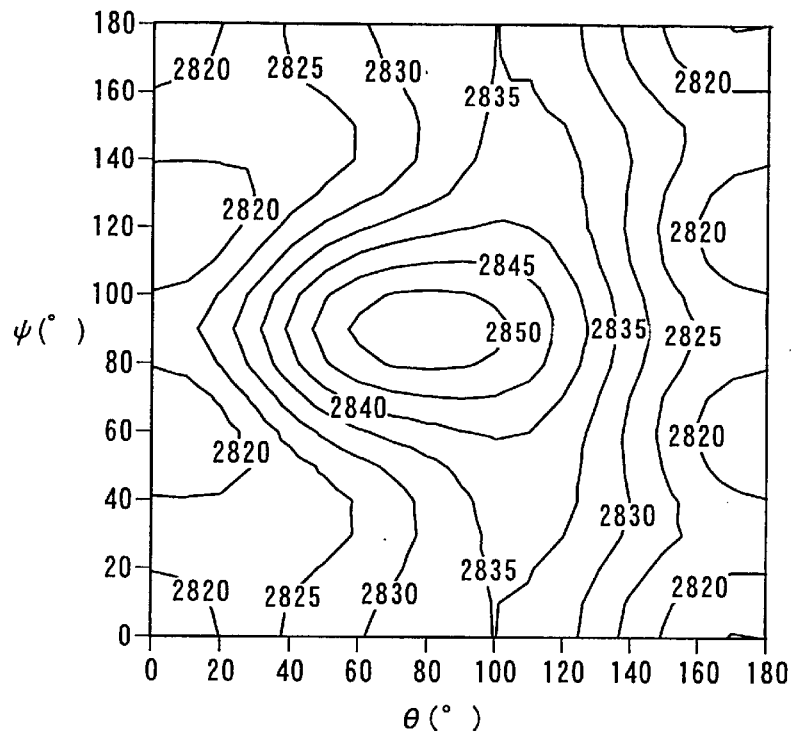
FIG. 3 is a graph shown in conjunction with a propagation velocity of the (0°, θ, ψ) LN (KH=0.7 )/glass-structure substrate.
Figure 4:
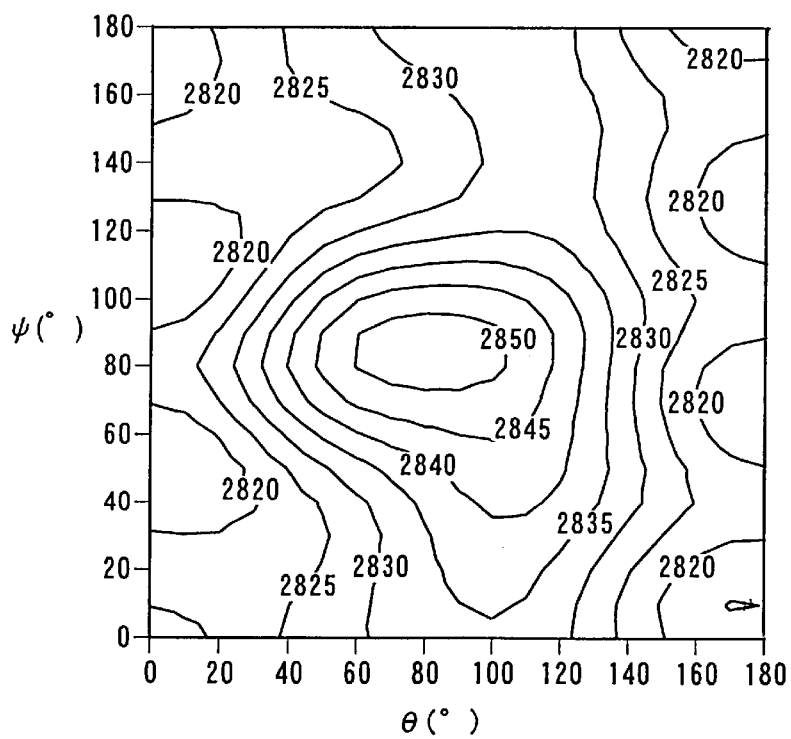
FIG. 4 is a graph shown in conjunction with a propagation velocity of a (10°, θ, ψ) LN (KH=0.7)/glass-structure substrate.
Figure 5:
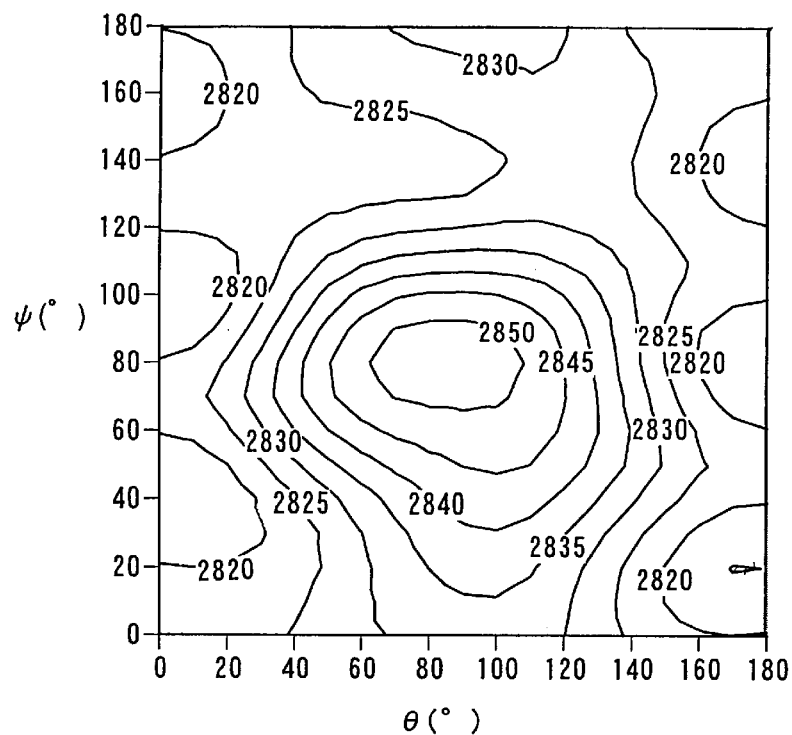
FIG. 5 is a graph shown in conjunction with a propagation velocity of a (20°, θ, ψ) LN (KH=0.7)/glass-structure substrate.
Figure 6:
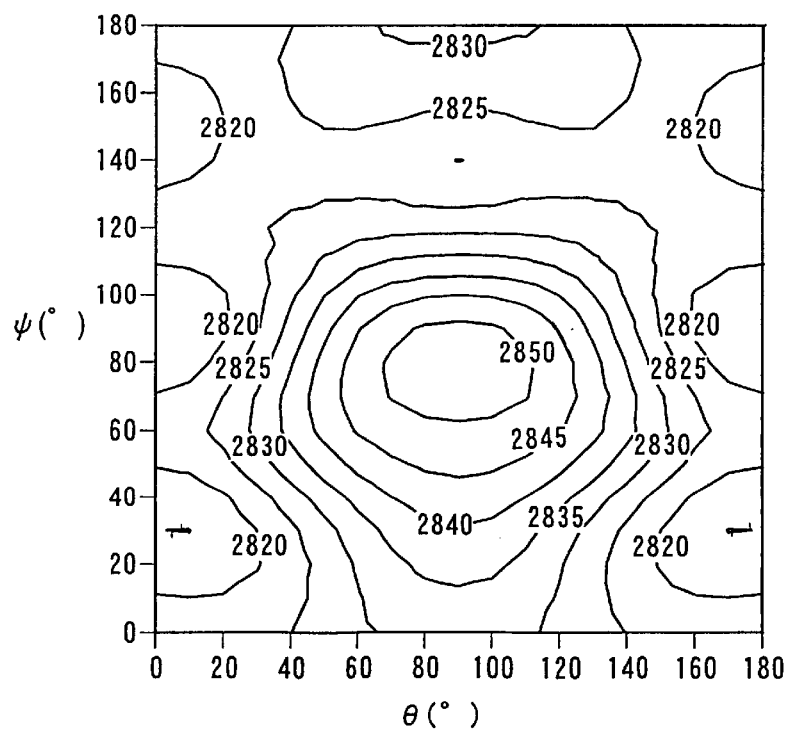
FIG. 6 is a graph shown in conjunction with a propagation velocity of a (30°, θ, ψ) LN (KH=0.7)/glass-structure substrate.
Figure 7:
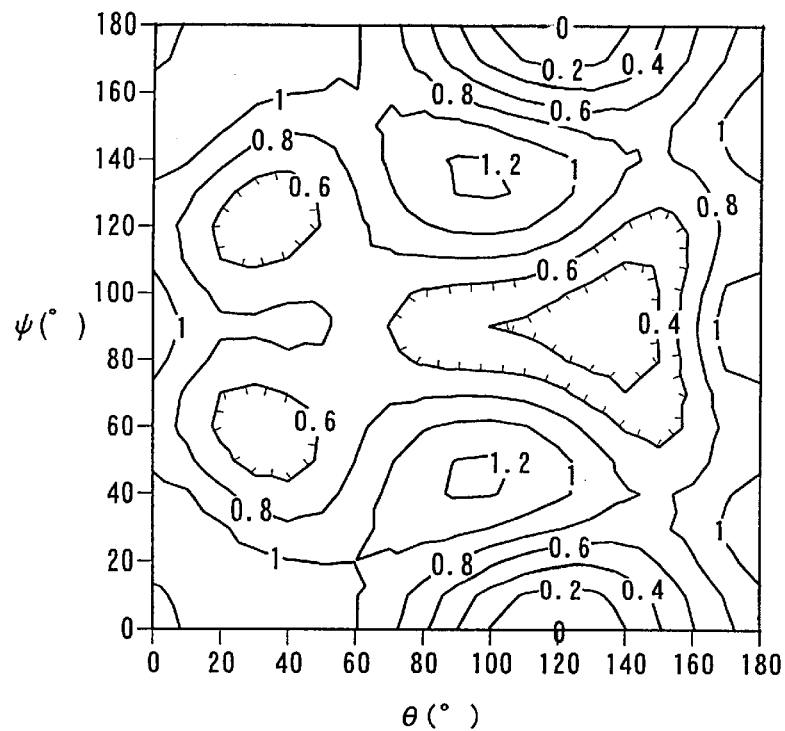
FIG. 7 is a graph shown in conjunction with $K^2$ of a (0°, θ, ψ) LN (KH=0.7)/glass-structure substrate.
Figure 8:
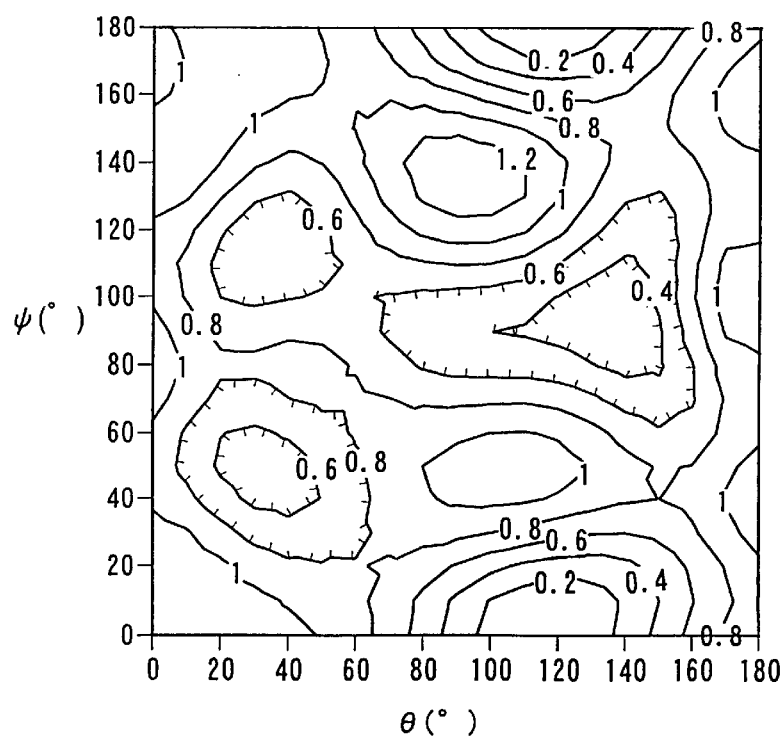
FIG. 8 is a graph shown in conjunction with $K^2$ of a (10°, θ, ψ) LN (KH=0.7)/glass-structure substrate.
Figure 9:
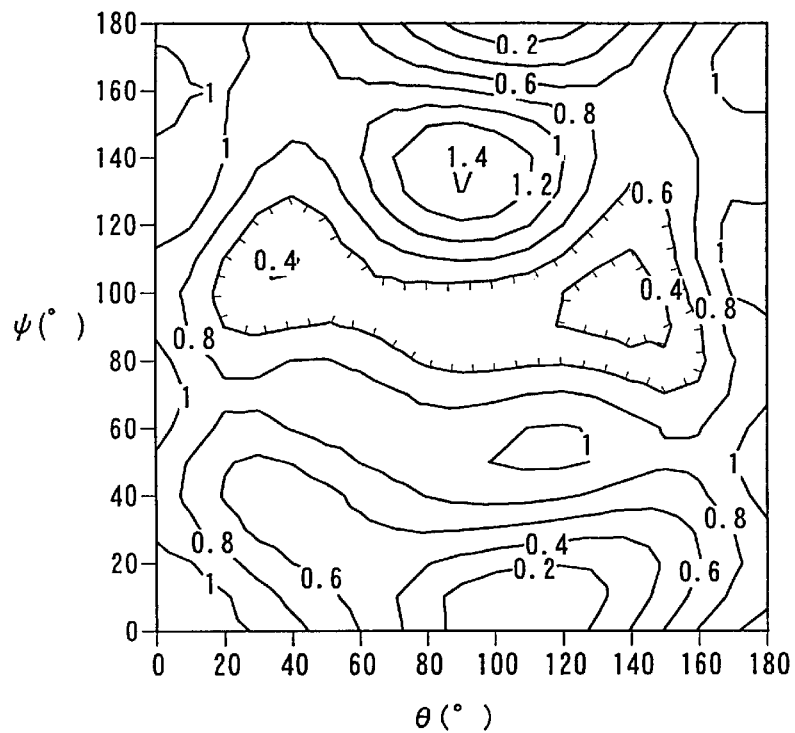
FIG. 9 is a graph shown in conjunction with $K^2$ of a (20°, θ, ψ) LN (KH=0.7)/glass-structure substrate.
Figure 10:
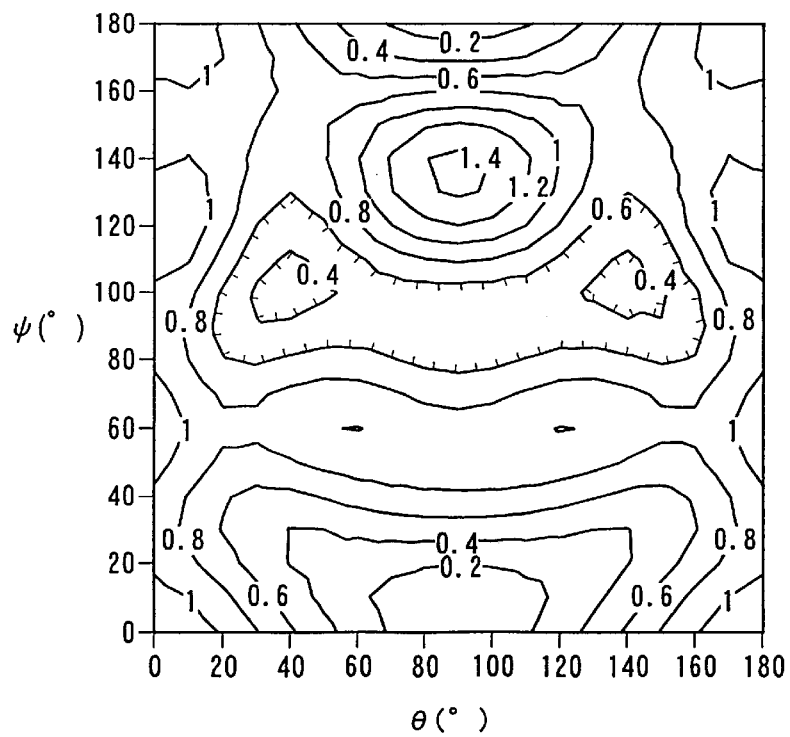
FIG. 10 is a graph shown in conjunction with $K^2$ of a (30°, θ, ψ) LN (KH=0.7)/glass-structure substrate
Figure 11:
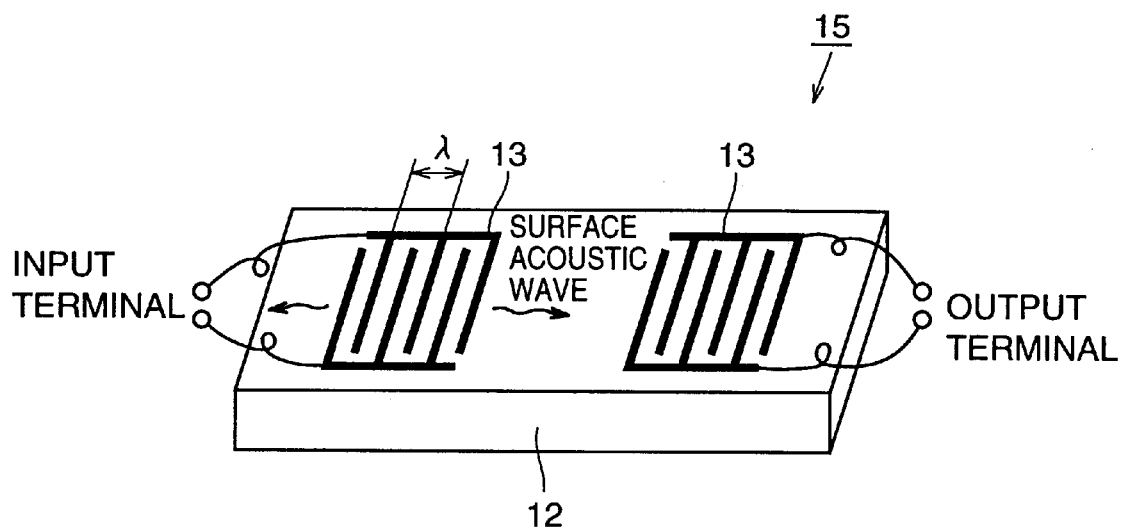
FIG. 11 is a perspective view showing a structure of a general SAW filter.
Figure 12:
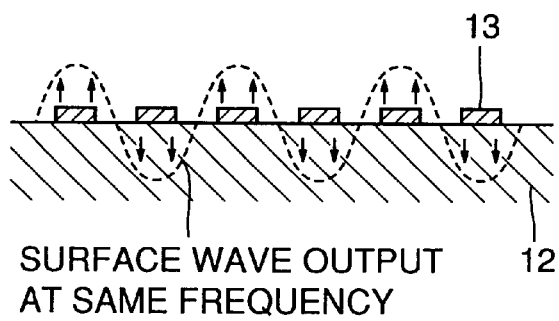
FIG. 12 is a diagram shown in conjunction with an operation of the SAW filter shown in FIG. 11.
Figure 13:
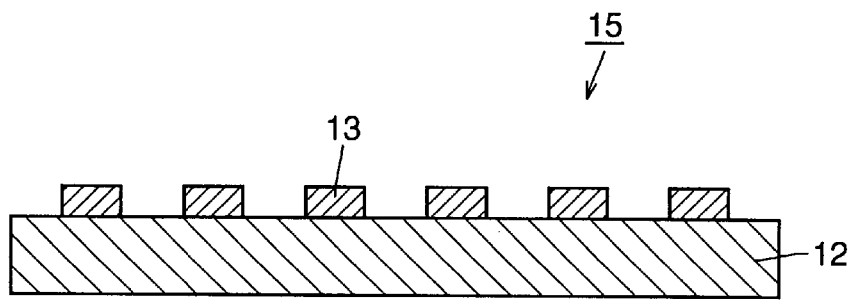
FIG. 13 is a cross sectional view schematically showing a structure of a conventional SAW device.
Figure 14:
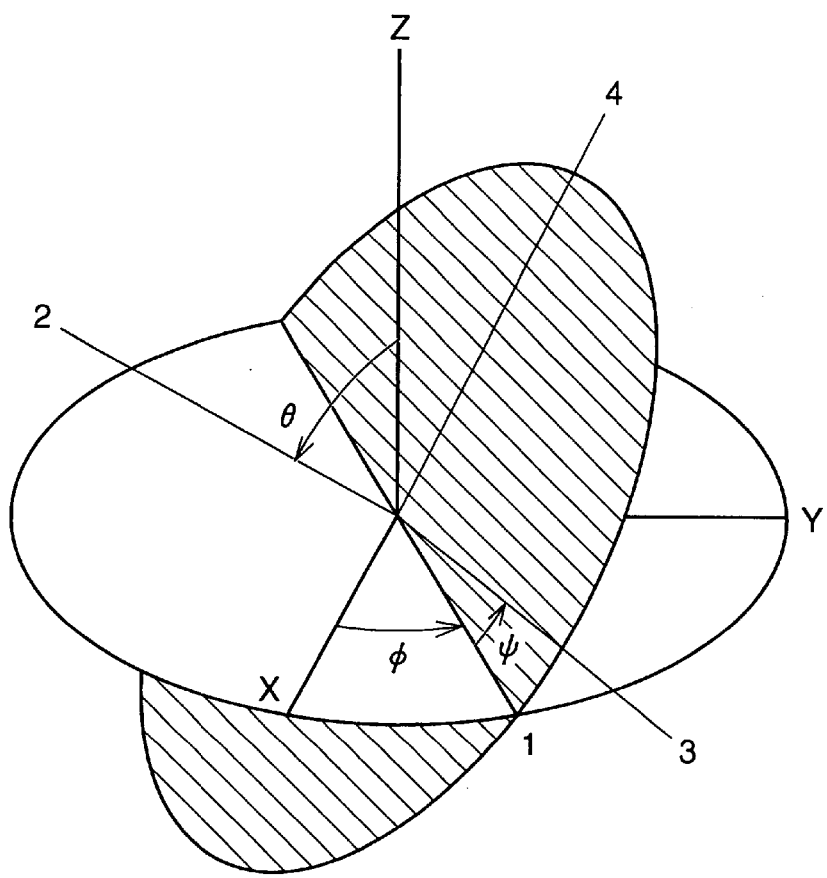
FIG. 14 is a diagram shown in conjunction with Eulerian angles.

For an LN/glass-structure substrate having Eulerian angles of (0°, 0°, 0°) shown in FIG. 1, a relation between a KH parameter of LN and the a propagation velocity was calculated. The result is shown in FIG. 2. The range of KH of interest is $0 \leq KH \leq 4.0$.

From FIG. 2, it was found that the propagation velocity is the lowest when KH equals to 0.7, and the propagation velocity as low as 2800 m/s is achieved when KH is at least 0.5 and at most 1.0. Similar results were obtained for all orientations.

Thus, it was found that the lowest propagation velocity can be achieved when the KH parameter of LN is 0.7 and a sufficiently low propagation velocity is achieved when KH is at least 0.5 and at most 1.0.

Then, a relation between a propagation velocity and Eulerian angles when KH parameter of LN is 0.7 was calculated. The results are shown in FIGS. 3 to 6. In addition, a relation between $K^2$ and the Eulerian angles was calculated. The results are shown in FIGS. 7 to 10.

The above mentioned calculations were performed over the ranges of $0° \leq \phi \leq 30°$, $0° \leq \theta \leq 180°$, and $0° \phi \leq 180°$, in view of symmetry crystal property.

From the results shown in FIGS. 3 to 10, it was found that angle permitting propagation velocity that is lower than 2820 m/s and $K^2$ that is higher than 1.4% is (30°, 90°, 140°). The resulting TCD of (30°, 90°, 140°) LN (KH=0.7)/glass-structure substrate was 15.56 ppm/° C. It was found that, from FIGS. 6 and 10, if the angles were in a range of (30°, 80° to 100°, 130° to 145°), a sufficiently low propagation velocity and $K^2$ that is at least 1.4 is achieved, and the same level of TCD, as mentioned above, is achieved.

A material constant of glass generally used for the material of electronic device was used in the calculation. The material constant of glass used for the calculation is shown in the following Table 2.

TABLE 2

Material Constant of Glass Used in Calculation

| | |
|---|---|
| density | 2.76 g/cm$^3$ |
| coefficient of thermal expansion | 46 × 10$^{-7}$° C. |
| dielectric constant | 5.8 |
| Young's modulus | 6.86 × 10$^3$ kg/mm$^2$ |
| Poisson's ratio | 0.28 |

To compare the cases where (30°, 90°, 140°) LN/glass substrate of the present invention and the (0°, 38°, 0°) LN substrate of Table 1 were used, it was found that although $K^2$ was low in the range of the present invention, the propagation velocity was lower by about 30% and TCD was considerably reduced by as much as 80%.

To compare the cases where (30°, 90°, 140°) LN/glass substrate of the present invention and the (90°, 90°, 112°) LT substrate of Table 1 were used, it was found that the range of the present invention produced better results in any of $K^2$, propagation velocity, and TCD. Namely, in the present invention, it was found that $K^2$ was higher, the propagation velocity was lower, and TCD was smaller.

Now, a method of manufacturing a SAW filter using the LN/glass substrate of the present invention having the above mentioned enhanced characteristics will be described.

Referring to FIG. 1, glass substrate 1 having the material constant shown in Table 2 and (30°, 80° to 100°, 130° to 145°) LN substrate 2 were bonded by a direct bonding technique, and an electrode 3 was formed on the surface of LN substrate 2. Here, the direct bonding technique allows direct bonding of substrates without any adhesion layer interposed. More specifically, hydrophilicity was applied to glass substrate 1 and LN substrate 2, which had been polished and washed, by an ammonia based solution, and then substrates 1 and 2 were bonded together by overlay hydrogen bonding.

In the present embodiment, a thermal treatment was performed after bonding, in order to increase a bonding tightness. An aluminum film of 1000 Å was formed on the substrate of the LN/glass structure by sputtering, and patterning was performed by photolithography for electrodes 3.

As described above, with the substrate of the SAW device of the present invention, as the glass substrate and the piezoelectric substrate are bonded together, thicknesses thereof are adjusted to reduce the sound velocity of the surface acoustic wave. Accordingly, electrode pitch λ of an IDT is reduced and a corresponding reduction in size of the SAW device is achieved.

In addition, the glass substrate and the piezoelectric substrate are combined and KH is set to at least 0.5 and at most 1.0, so that the electric field distribution can be adjusted to concentrate in the piezoelectric substrate. Thus, the SAW can efficiently be excited and $K^2$ is increased.

Further, as the glass substrate and the piezoelectric substrate are bonded together, respective TCDs and TCVs are mutually cancelled, whereby the temperature characteristic is enhanced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A surface acoustic wave device, comprising a glass substrate, a piezoelectric substrate including LiNbO$_3$ formed on said glass substrate, and an electrode formed on said piezoelectric substrate, characterized in that a product of K and H is at least 0.5 and at most 1.0, where a pitch of said electrode is λ, a thickness of said piezoelectric substrate is H, and K equals to 2π/λ.

2. The surface acoustic wave device according to claim 1, characterized in that said LiNbO$_3$ is (30°, 80° to 100°, 130° to 145°) in an Eulerian angles representation.

3. The surface acoustic wave device of claim 1, said glass substrate being made of a material selected from quartz glass, aluminosilicate glass, borosilicate glass, soda glass or lead silicate glass.

4. The surface acoustic wave device of claim 1, said electrode being made from aluminum.

5. The surface acoustic wave device of claim 2, said piezoelectric substrate being a (30°, 90°, 140°) LiNbO$_3$ substrate.

* * * * *